United States Patent [19]

Taylor

[11] 4,048,526

[45] Sept. 13, 1977

[54] KINETIC SENSOR EMPLOYING POLYMERIC PIEZOELECTRIC MATERIAL

[75] Inventor: Allen L. Taylor, Woodbury, Minn.

[73] Assignee: Minnesota Mining and Manufacturing Company, St. Paul, Minn.

[21] Appl. No.: 706,297

[22] Filed: July 19, 1976

Related U.S. Application Data

[63] Continuation-in-part of Ser. No. 603,193, Aug. 8, 1975, abandoned.

[51] Int. Cl.² .............................................. H01L 41/04
[52] U.S. Cl. ...................................... 310/329; 310/363
[58] Field of Search ................... 310/8.1, 8.4, 8.3, 8.5, 310/8.6, 8.7, 9.7, 9.8

[56] References Cited

U.S. PATENT DOCUMENTS

| | | | |
|---|---|---|---|
| 2,808,524 | 10/1957 | Feinstein | 310/8.4 X |
| 3,030,606 | 4/1962 | Harris | 310/8.4 |
| 3,241,373 | 3/1966 | Ricketts et al. | 310/8.4 UX |
| 3,374,663 | 3/1968 | Morris | 310/8.4 X |
| 3,832,580 | 8/1974 | Yamamuro et al. | 310/8.5 |

Primary Examiner—Mark O. Budd
Attorney, Agent, or Firm—Cruzan Alexander; Donald M. Sell; Walter N. Kirn

[57] ABSTRACT

A motion detector that includes one or more sensing units fastened by at least one end to an interior portion of a housing. The sensing units are flexible so that they readily bend in response to movement of the detector, and a small weight is mounted on each sensing unit to accentuate such bending. Each sensing unit includes a thin strip of poled, polymeric piezoelectric material having planar surfaces. Conductive electrodes are carried on only the portions of such surfaces adjacent the end (ends) of the sensing unit fastened to the housing. An electronic circuit is connected across the conductive electrodes for sensing electrostatic charges that are produced by the bending of the piezoelectric material of the sensing units and for providing a signal indication of such bending.

6 Claims, 5 Drawing Figures

U.S. Patent    Sept. 13, 1977    4,048,526
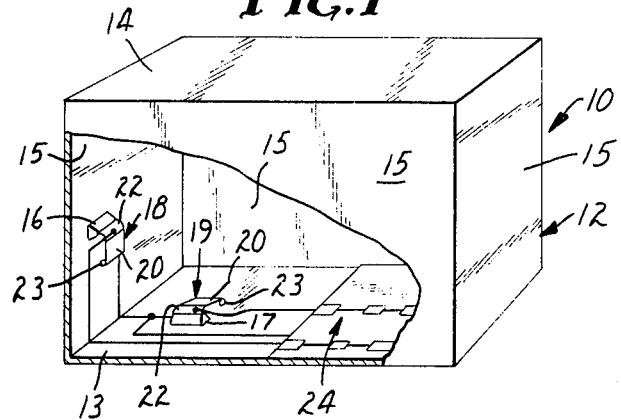
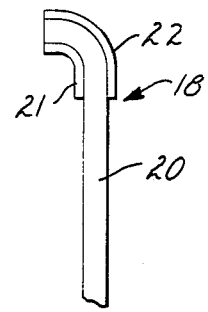
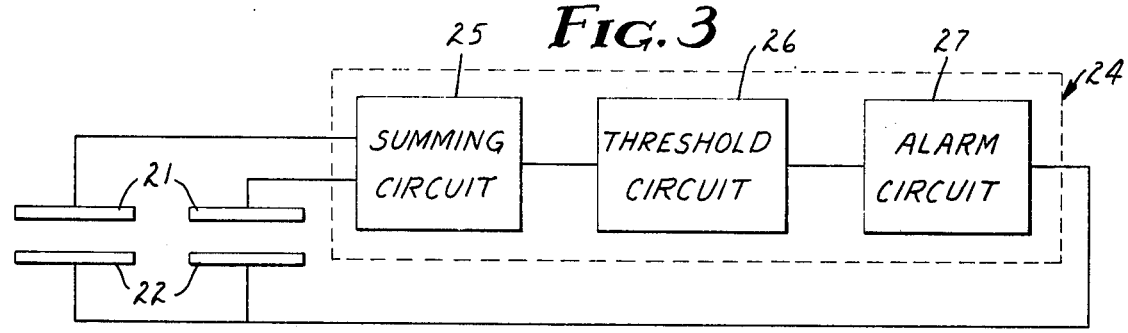
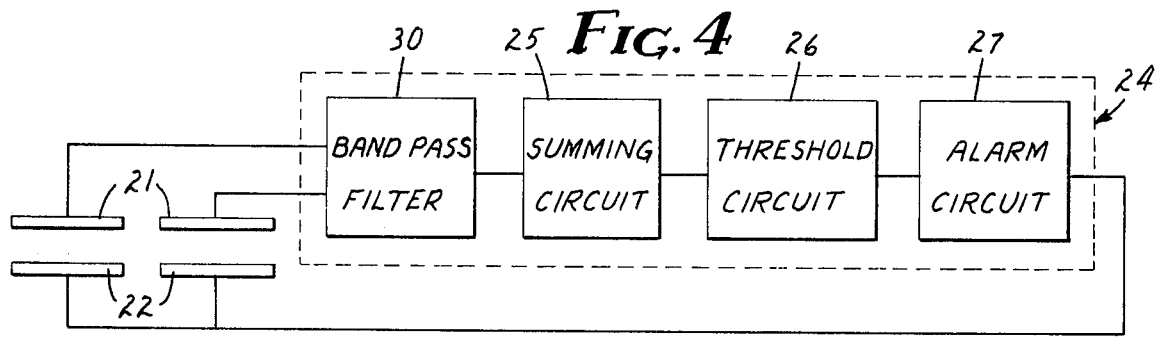
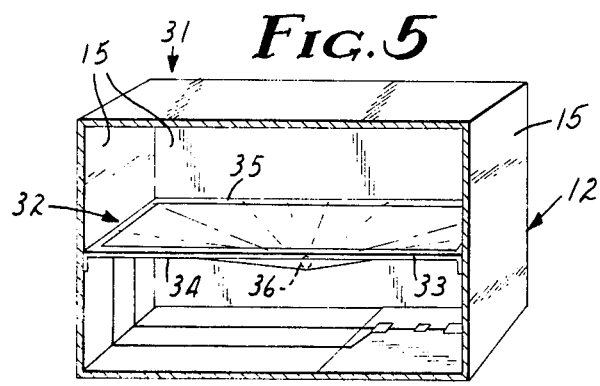

KINETIC SENSOR EMPLOYING POLYMERIC PIEZOELECTRIC MATERIAL

This is a continuation-in-part of my co-pending application Ser. No. 603,193, filed Aug. 8, 1975, now abandoned. This application is also related to my co-pending application Ser. No. 603,155, filed Aug. 8, 1975.

BACKGROUND OF THE INVENTION

1. Field of the Invention

The present invention relates in general to detectors for sensing motion and more specifically to such detectors that employ polymeric piezoelectric sensing mediums.

2. Description of the Prior Art

Devices are known in the art that employ piezoelectric crystals that are weight loaded such that they vibrate during movement of the devices as shown in U.S. Pat. No. 3,456,134 issued to Ko; 3,186,237 issued to Forrest, and 3,667,293 to Moore. The Ko and Forrest patents show weights end mounted in cantilever fashion on the piezoelectric crystals and the Moore patent shows a weight center mounted on the piezoelectric crystals. The sensitivity of such detectors is limited by the rigidity of the crystals which cannot bend very much. Such devices develop rather uniformly distributed piezoelectric charge along their opposite surfaces and consequently, where shown, the electrodes on those surfaces cover substantially the entire surfaces thereof.

U.S. Pat. No. 3,832,580 to Yamamuro et al. shows a mechanical energy to electrical energy transducer utilizing polymeric piezoelectric film in FIG. 7. Its operation, however, is dependent upon compression and extension in a direction within the planar surface of the piezoelectric film. Such device suggests no bending of the film, electrostatic charges rather uniformly distributed along the entire surface of the film and electrodes covering substantially the entire surfaces thereof.

SUMMARY OF THE INVENTION

The motion detector of the present invention uses one or more very flexible piezoelectric sensing units that are weight loaded. As such, the units may bend large amounts for high sensitivity and such bending is concentrated in one or more portions of the sensing unit to further enhance the sensitivity and permit the usage of small electrodes.

A detector according to the present invention includes a housing in which at least one sensing unit is attached by fastening one or more of its ends to the interior of the housing. Each sensing unit includes a flexible layer of poled, polymeric, piezoelectric material which produces opposite charges on its opposite surfaces when subjected to bending. A weight is connected to the sensing unit and acts as an inertial mass to enhance bending of the sensing unit when the housing is moved. Such bending primarily occurs in portions adjacent where the sensing unit is attached to the housing and a flexible conductive electrode is carried on the opposite surfaces of the piezoelectric layer at such portions. The conductive electrodes are electrically connected to sensing circuitry that provides a signal indicating movement of the object upon which the housing is placed.

In a preferred embodiment two sensing units are disposed in the housing, which housing shields the units from spurious bending caused by wind or other elements. These sensing units are fastened at only one end to the housing. Weights are mounted on the free ends of the sensing units such that the weights have maximum mechanical advantage for producing bending of the sensing units. Such bending occurs primarily in the portion adjacent the end fastened to the housing and the conductive electrodes are only at such portion. The sensors are positioned in an orthogonal relationship to one another to provide an output for substantially any direction in which the housing is moved. The sensors have a pendular motion and preferably a bandpass filter tuned to the pendular frequency is disposed in series between the sensing units and the electronic sensing circuitry of the detector to insulate the detector from spurious signals.

In a modified embodiment, a single drum head type sensing unit is fastened at each side (end) to the housing and is loaded by a weight that is mounted substantially midway between the fastened sides of the sensing unit. The conductive electrodes are again at the portions adjacent the sides fastened to the housing. Such configuration provides a more durable detector than that of the first embodiment for use in applications in which the detector may be subjected to severe movement.

BRIEF DESCRIPTION OF THE DRAWINGS

FIG. 1 is a perspective view of a preferred embodiment of the present invention that includes a housing with portions of a sidewall cut away to expose two sensing units and sensing circuitry disposed therein;

FIG. 2 is an enlarged fragmented side view of one of the sensing units of FIG. 1;

FIG. 3 is a block diagram of an electronic sensing circuitry connected to the sensing units of FIG. 1;

FIG. 4 is a block diagram illustrating the use of a bandpass filter with the sensing circuitry of FIG. 3; and FIG. 5 is a perspective view of a modified form of the embodiment of FIG. 1.

DESCRIPTION OF THE PREFERRED EMBODIMENTS

Referring now to the drawings and with reference first to FIG. 1, a motion detector 10 that forms a preferred embodiment of the present invention is shown. The detector 10 is adapted to be manufactured in miniature size so that it can be attached to or mounted on a wide variety of items such as bicycles, skis, automobiles and the like to indicate whether or not such items are being moved.

The detector 10 includes a housing 12 having a base wall 13, a top wall 14, side walls 15 and mounting brackets 16 and 17. Disposed in the housing 12 are two very flexible sensing units 18 and 19 that are respectively fastened at one end to the mounting brackets 16 and 17, and are preferably aligned perpendicular to one another.

The sensing units 18 and 19 are similar in construction and, as indicated by the showing of the sensing unit 18 in FIG. 2, each unit 18 and 19 includes a thin flexible layer 20 of poled, polymeric, piezoelectric material that develops opposite polarity electrostatic charges on its opposite broadest surfaces when bent. The layer 20 is vapor coated with a flexible conductive material on only the portions of its opposite broadest surfaces which are adjacent the end fastened to the bracket to form conductive electrodes 21 and 22 on the layer 20. Preferably, the layer 20 is formed from polyvinylidene fluoride and the conductive material is aluminum, nickel, copper or the like. Referring again to FIG. 1, a small weight 23 is mounted on each of the sensing units 18 and 29 and is sufficiently heavy to act as an inertial mass. Preferably, the weight 23 is mounted on the outer free end of each of the sensing units 18 and 19 so that the weight 23 has the greatest mechanical advantage for exerting stress thereon. When the detector 10 is moved, the inertial weight 23 causes bending of the sensor 18, for example, and results in pendular motion of that sensor at a natural pendular frequency. Because the piezoelectric layer 20 is highly flexible, the weight 23 can move over a wide range of distances to provide a high sensitivity detector. Also, substantially all the bending of the piezoelectric layer 20 that results from such movement occurs in the portion of the layer 20 adjacent the end fastened to the housing. By concentrating the bending in one portion of the layer 20, the piezoelectric charge density in this portion is high. This provides large electrical signals and permits the usage of small electrodes. The small electrodes have a small electrical capacity and this results in an increased voltage output.

It is preferable that at least the two sensing units 18 and 19 are employed in the detector 10 to provide highly reliable and accurate sensing. This can be accomplished by turning the housing 12 over such that the bottom 13 replaces the top 14 and the sensors 18 and 19 can then both provide pendular motion. The main reason that the two sensing units 18 and 19 provide better operation than only one sensing unit is because the units 18 and 19 are more senstive to movement in a direction traverse to their planar surfaces. Through the use of the two sensing units 18 and 19 that are aligned perpendicular to one another, movement in substantially any direction can be sensed and the sensing is more uniform. A single sensing unit could be used in operations that can tolerate less reliability and accuracy, but if only one sensing unit is employed in the detector 10, the sensitivity of the detector in a direction not traverse to the planar surfaces of the sensing unit is not as great as in the direction traverse to the sensing unit.

Referring now to FIG. 3, sensing circuitry 24 is preferably connected across the conductive electrodes 21 and 22 of the units 18 and 19. The sensing circuitry 24 may include a wide variety of standard components for detecting electrical signals as a result of electrostatic charges on the conductive electrodes 21 and 22, and for providing a detection signal in response to such charges. Preferably, the circuitry 24 includes a summing circuit 25 that is supplied with electrostatic charges from the conductive electrodes 21 and 22, a threshold circuit 26, and an alarm 27 connected to the output of the threshold circuit 26. The summing circuit 25 sums the magnitudes of the electrical signals provided by the electrodes 21 and 22. The summed output of the circuit 25 is then fed to the threshold circuit 26, which circuit is variably adjustable to provide an output to the alarm 27 upon receiving a desired level of input from the conductive electrodes 21 and 22 in order that sensitivity of the detector 10 can be easily regulated.

The sensing units 18 and 19 are very flexible and will provide pendular motion in response to light movement of the detector 10 and accordingly, the detector 10 can be made extremely sensitive. The use of the threshold circuit 26 is particularly advantageous in the present invention because it permits the sensitivity of the detector 10 to be decreased to relatively low levels. The use of the summing circuit 25 is not essential to the present invention, but if the circuit 25 is employed it is preferable that the sensing units 18 and 19 be designed to have different natural pendular frequencies. This is to avoid the possibility of the units 18 and 19 moving out of phase with one another in such fashion that their electrostatic outputs cancel.

To improve the reliability of the detector 10 it may be preferred to employ a bandpass filter 30 in the sensing circuitry 24 to isolate the summing circuit 25 from the conductive layers 21 and 22, as shown in FIG. 4. The filter 30 should be tuned to the natural pendular frequency of the sensing units 18 and 19 to screen spurious signals.

Referring now to FIG. 5, a modified embodiment of the present invention is shown in the form of a detector 31 that includes the housing 12 and the same type of electronic circuitry 24 as employed by the detector 10. However, the detector 31 differs from the detector 10 on the basis that it includes a single drum head sensing unit 32 that is fastened at all its edges to the side walls 15 of the housing 12. Similar to the sensing units 18 and 19, the unit 32 is formed from a single layer of flexible piezoelectric material 33. Flexible conductive electrodes 34 and 35 are coated on only the portions of the layer 33 that are adjacent the edges fastened to the side walls 15 which is where substantial bending occurs. A small weight 36 is preferably mounted near the center of the sensing unit 32 to accentuate its movement similar to the use of the weight 23 with the sensing units 18 and 19. The sensing unit 32 is of sufficient length that it is not stretched tightly between the sidewalls 15 of the housing 12 but instead has a considerable amount of sag in order that the sensing unit 31 will move in response to motion in substantially all directions.

Because all edges of the sensing unit 32 are attached to the housing sidewalls 15, the detector 31 is adapted to be used in situations wherein it may be subjected to severe motion. By employing the sensing unit 32 that has not free edges, the possibility that movement of the detector 31 may be so severe that the unit 32 will move sufficiently to short out or be permanently damaged is substantially eliminated. Thus, this modified embodiment of the present invention provides a durable, convenient simplistic means for indicating motion of an object upon which it is placed. The use of the drum head type layer 33 is not critical to this embodiment and instead a narrow strip of piezoelectric material may be employed that is only attached at two of its opposite ends to two opposite housing sidewalls 15.

What is claimed is:

1. A detector for producing a signal in response to movement of the detector, comprising:
   a housing;
   a sensing unit fastened by one or more ends thereof to said housing and having:
     a flexible layer of poled, polymeric, piezoelectric material that produces electrostatic charges of opposite polarity on its opposite surfaces when subjected to bending; and
     a flexible conductive electrode carried on no more than the portions of each surface of said piezoelectric layer adjacent said one or more ends;
   a weight connected to said sensing unit in such fashion that said weight acts as an inertial mass to produce bending of the sensing unit in respect to movement of said detector; and
   sensing circuitry electrically connected with the conductive electrodes carried on each surface of said piezoelectric layer to sense said electrostatic charges and to provide a signal indicating motion of said detector.

2. A motion sensing detector as recited in claim 1, wherein said sensing unit is fastened at only one end to said housing, said conductive electrode is carried on only the portions of each surface of said piezoelectric layer adjacent said one end, and said weight is mounted near the free end of said sensing unit to provide pendular motion of said sensing unit in response to motion of said detector.

3. A motion sensing detector as recited in claim 2, wherein said sensing circuitry includes a bandpass filter tuned to the natural pendular frequency of said sensing unit and weight.

4. A motion sensing detector as recited in claim 1, wherein said sensing unit is fastened by at least two opposite ends to said housing and said weight is mounted between said fastened ends.

5. A motion sensing detector as recited in claim 1, wherein said detector includes two sensing units disposed in a perpendicular relationship to one another.

6. A motion sensing detector as recited in claim 1, wherein said piezoelectric layer is formed from polyvinylidene fluoride.

* * * * *

UNITED STATES PATENT AND TRADEMARK OFFICE
CERTIFICATE OF CORRECTION

PATENT NO. : 4,048,526
DATED : September 13, 1977
INVENTOR(S) : Allen L. Taylor

It is certified that error appears in the above-identified patent and that said Letters Patent are hereby corrected as shown below:

Column 1, line 19, change "Ko;" to --- Ko, No. ---.

Column 4, line 39, change "not" to --- no ---.

Column 4, line 65, claim 1, change "respect" to --- response ---.

Signed and Sealed this

Seventh Day of February 1978

[SEAL]

Attest:

RUTH C. MASON
Attesting Officer

LUTRELLE F. PARKER
Acting Commissioner of Patents and Trademarks